US007281228B2

(12) United States Patent
Oberlaender et al.

(10) Patent No.: US 7,281,228 B2
(45) Date of Patent: Oct. 9, 2007

(54) CONFIGURABLE MEMORY SYSTEM FOR EMBEDDED PROCESSORS

(75) Inventors: Klaus J. Oberlaender, Neubiberg (DE); Ralph Haines, Atherton, CA (US)

(73) Assignee: Infineon Technologies AG, Neubiberg (DE)

( * ) Notice: Subject to any disclaimer, the term of this patent is extended or adjusted under 35 U.S.C. 154(b) by 627 days.

(21) Appl. No.: 10/777,863

(22) Filed: Feb. 11, 2004

(65) Prior Publication Data

US 2005/0177697 A1 Aug. 11, 2005

(51) Int. Cl.
*G06F 17/50* (2006.01)
(52) U.S. Cl. ............... 716/11; 716/2; 716/17
(58) Field of Classification Search ........... 716/2, 716/9, 11, 17
See application file for complete search history.

(56) References Cited

U.S. PATENT DOCUMENTS

| 5,678,021 | A | 10/1997 | Pawate et al. |
| 5,812,418 | A | 9/1998 | Lattimore et al. |
| 5,974,493 | A * | 10/1999 | Okumura et al. ........ 710/307 |
| 6,493,855 | B1 | 12/2002 | Weiss et al. |
| 6,553,552 | B1 | 4/2003 | Khan et al. |
| 6,918,015 | B2 * | 7/2005 | Kessler et al. ........... 711/148 |
| 2001/0010057 | A1 | 7/2001 | Yamada |
| 2005/0108711 | A1 * | 5/2005 | Arnold et al. ........... 718/100 |

FOREIGN PATENT DOCUMENTS

| JP | 63-081569 | 4/1988 |
| WO | WO 01/61501 A1 | 8/2001 |

OTHER PUBLICATIONS

Yamaoka et al., "A System LSI Memory Redundancy Technique Using an ie-Flash (Inverse-Gate-Electrode Flash) Programming Circuit", IEEE Journal of Solid-State Circuits, vol. 37, No. 5, pp. 599-604, Piscataway, N.J., U.S.A. (May 2002).
Okuda et al., "A 12-ns 8-Mbyte DRAM Secondary Cache for a 64-bit Microprocessor", IEEE Journal of Solid-State Circuits, vol. 35, No. 8, pp. 1153-1158, Piscataway, N.J., U.S.A. (Aug. 2000).

* cited by examiner

*Primary Examiner*—Thuan Do
(74) *Attorney, Agent, or Firm*—Dickstein, Shapiro, LLP.

(57) ABSTRACT

An embedded processor architecture includes a processing core with configurable memory system. Memory components can be inserted, omitted and resized in different configuration of the memory system without causing irregular features that may cause wasted silicon area. Furthermore, all the various configurations of the memory system are designed to interface with the processing core so that the processing core can be reused without change.

37 Claims, 6 Drawing Sheets

CONFIGURABLE MEMORY SYSTEM FOR EMBEDDED PROCESSORS

FIELD OF THE INVENTION

The present invention relates to microprocessors, and more particularly to a floor plan friendly configurable memory system.

BACKGROUND OF THE INVENTION

Modern electronic systems are increasingly using microprocessors to provide greater flexibility and functionality. For example, many home entertainment components such as DVD players include microprocessors to perform video decompression. Computer peripherals such as laser printers, modems, and disk drives also include microprocessors to perform various functions. In the past many of these devices used microprocessors on circuit boards. The circuit boards would include support chips for the microprocessor such as memory, as well as chips to perform the functions of the overall device.

Advances in silicon processing techniques have allowed creation of systems, which include the microprocessor and the support logic, and memory, on a single chip. Further integration also allows systems on a chip that include additional logic functions with the microprocessor and support logic on a single chip. These microprocessors, which are "embedded" within the system, are generally referred to as embedded processors. For clarity, "embedded processor" as used herein includes a processing core, the memory system for the processing core, and support logic for the processing core and memory system.

Because designing, simulating, laying out (the process of deciding how the various components of the processor are physically placed on a chip), producing and verifying processors, including microprocessors, microcontrollers, and embedded processors are so difficult, most users purchase the microprocessors from a handful of processor companies that have expertise in designing, simulating, laying out, producing and verifying processors.

Different users may have vastly different requirements for microprocessors, especially in the market for embedded processors. Memory configurations for the embedded processor may vary greatly between customers. Providing a small number of memory configurations of a processor risks losing potential users who may turn to other sources for a processor that more closely matches the user's requirements. However, providing a custom memory configuration for each user would require vast resource to design and simulate each custom configuration.

Figure 1A:
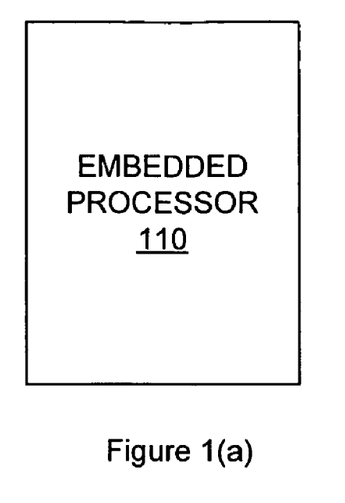
FIG. 1(a) illustrates the shape of an embedded memory system.
Figure 1B:
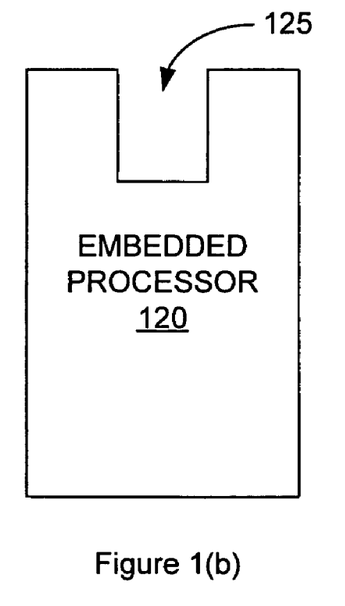
FIG. 1(b) illustrates the shape of an embedded memory system having an irregular feature that may cause wasted silicon area.

Because embedded processors are often placed on the same silicon die as custom chips, different embedded processors must also compete based on silicon area. Designs requiring larger silicon area would be less competitive than designs requiring less silicon area because dies requiring larger silicon area are more expensive. Furthermore, the shape of the area required by the embedded processor and memory may increase the cost of the die. FIG. 1(a) illustrates an embedded processor 110 having a regular rectangular shape. FIG. 1(b) illustrates an embedded processor 120 having a irregular shape. Specifically, embedded processor 120 has rectangular shape that is missing a notch 125. Embedded processor system 110 and embedded processor 120 require the same silicon area. However, notch 125 might not be useable by other components of the system due to layout, placement, or routing issues. Therefore, effectively, embedded processor 120 would require more silicon area than embedded processor 110 due to the irregular shape of embedded processor 120. Therefore, embedded processor 110 would be more expensive to use than embedded processor 110.

As explained above embedded processors must support multiple memory configurations to satisfy different customers. In conventional embedded processors, changing the size of different memory components or selecting different memory components often lead to irregular shaped embedded processors. For example, notch 125 may be caused in embedded processor 120 because embedded processor 120 is configured to not include a program cache. Notches or other irregularities can also be caused by using differently sized memory banks or memory towers. Alternatively, the layout of some embedded processors are redone to avoid the notches or other irregularities, however redoing a layout is extremely time consuming and may would entail risk of error in the layout process.

Hence there is a need for a configurable memory system of an embedded memory system having a regular shape to provide efficient use of area.

SUMMARY

Accordingly, a configurable memory system for embedded processors in accordance with one embodiment of the present invention is arranged to have a regular rectangular shape in all configurations of the memory system. By having a regular rectangular shape the silicon area required by an embedded processor using the configurable memory system does not include notches or other irregular features that may cause wasted silicon area.

Specifically, in one embodiment of the present invention, customers can design a semi-custom embedded processor by selecting memory components and configuring the memory components with respect to the memory sizes, the number of ways (for cache memories), the type of memories and various other features. The memory components are generated so that the total width of a memory component is the same as other memory components as well as the same width as the processing core. For example, in one embodiment of the present invention, a program cache with four memory towers. The total width of the memory component is equal to the sum of the widths of the four memory towers. Thus the total width of the four memory towers would be equal to the width of the processing core. The embedded processor is laid out so that a first memory component is adjacent to a first side of the processing core and a second memory component is adjacent to the first memory component and on opposite sides of the first memory component with respect to the processing core. A third memory component can be placed adjacent to the processing core on an opposite side of the processing core with respect to the first memory component. In other words memory components form a first stack on one side of the processing core and can form a second stack on the opposite side of the processing core. Each stack can contain several memory components. Even though the memory components can be of different types and different memory sizes, the width of the memory components and the processing core are kept the same so that the embedded processor has a rectangular shape.

The present invention will be more fully understood in view of the following description and drawings.

DETAILED DESCRIPTION

Embedded processors with configurable memory systems can be customized for customers having different requirements. However different memory configurations, especially memory configuration involving different memory systems and types of memory, lead to irregular features in the shape of the embedded processor The area of the irregular shapes are generally not useable by other logic circuits on the die and thus would result in wasted area on the die, which may lead to higher costs. The present invention uses a novel memory architecture to minimize the occurrence of irregular features on the shape of the embedded processor irregardless of the memory configuration selected.

Figure 2:
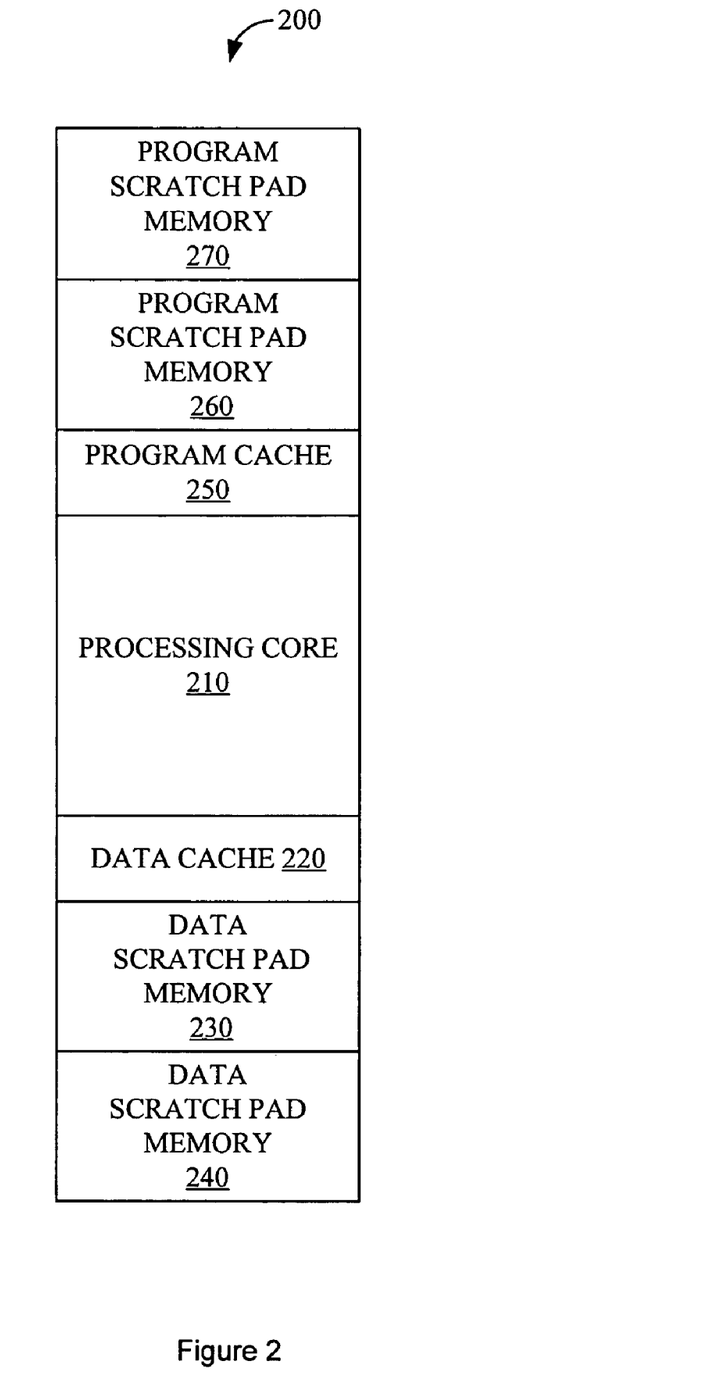
FIG. 2 is a simplified block diagram of an embedded processor with a memory system in accordance with one embodiment of the present invention.

FIG. 2 is a simplified block diagram of an embedded processor architecture 200 in accordance with one embodiment of the present invention. Embedded processor architecture 200 includes a processing core 210 with a configurable memory system having a data cache 220, a first data scratch pad memory 230, and a second data scratch pad memory 240, a program cache 250, a program scratch pad memory 260, and a program scratch pad memory 270. In general processing Core 210 includes the main processing elements such as the arithmetic logic unit (ALU), the integer pipeline, load/store pipeline and memory interfaces. Some embodiments of the present invention also include clock trees in processing core 210.

Data cache 230 is located adjacent to processing core 210 to minimize propagation delays between processing core 210 and data cache 230. Data scratch pad memory 230 is located adjacent to the side of data cache 220 that is opposite the side adjacent to processing core 210. Data scratch pad memory 240 is located adjacent to the side of data scratch pad memory 230 that is opposite the side adjacent to data cache 220.

Program cache 250 is located adjacent to processing core 210 to minimize propagation delays between processing core 210 and program cache 250. Specifically, Data cache 230 and program cache 250 are located on opposite sides of processing core 210 to minimize irregular features in the various memory configurations as described below. Program scratch pad memory 260 is located adjacent to the side of program cache 250 that is opposite the side adjacent to processing core 210. Program scratch pad memory 270 is located adjacent to the side of program scratch pad memory 260 that is opposite the side adjacent to program cache 250. Generally, different memory components have differing priority levels, the higher the priority level the closer the memory component should be to the processing core. Thus, caches would in general have higher priority levels than scratch pad memory, because the physical timing of caches is more critical than scratch pad memories.

The width of each memory component is equal and does not change with the size of each memory component. For consistency and clarity, "width" as used herein with respect to the memory components and the processing core refers to the dimension parallel to the sides of processing core 210 that are adjacent to the memory components. Conversely, "length" refers to the dimension perpendicular to the side of processing core 210 that is adjacent to the memory components.

Generally, the width of the memory components should be no larger than the width of processing core 210. Most embodiments of the present invention attempt to make the width of the memory components and the width of processing core 210 equal so that embedded processor 200 has a rectangular shape. In most embodiments of the present invention, width of the processing core and the width of all the memory components are designed to be equal, regardless of the size or type of the memory component. In general, the minimum width of a memory component is dependent on the number of sense amps that are activated in one memory access. Generally, caches that are fully associative or set associative would require more sense amps than the scratch pad memories. To make the memory components have the same width, most embodiments of the present invention make use of additional post sense amp multiplexers as necessary to make the widths of the different memory components equal.

The memory system is configurable to include or to not include the various caches and scratch pad memories. Furthermore each cache and scratch pad memory can be configured to a variety of different sizes. The placement of the memory components depend on the priority level of the memory component. As explained above, caches generally have higher priority levels than scratch pad memories. If a high priority level memory component, such as a cache is omitted, lower priority memory components that were further from processing core 210 would move closer to processing core 210 to replace the omitted memory component. For example, if data cache 220 is omitted in a particular memory configuration, data scratch pad memory 230 slide up to be placed adjacent to processing core 210, and data scratch pad memory 240 would slide up to remain adjacent to data scratch pad memory 230. Because the memory components have the same width, omission or inclusion of each memory component does not introduce irregular features to the shape of the embedded processor.

As explained above, the width of the memory components are fixed. Thus, in different memory configurations, the length of each memory component changes with the size of the memory. In some embodiments of the present invention a memory generator generates a particular memory component to match the specification of the memory component during the creation of the design file for the embedded processor. In other embodiments, most of the different configurations of the memory components are pre-generated.

Figure 3:
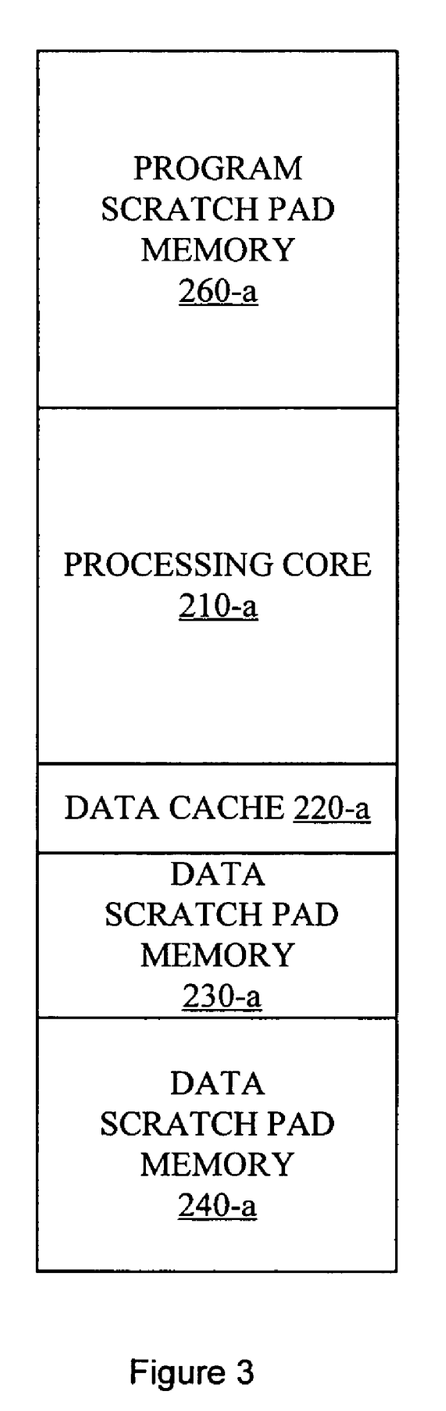
FIG. 3 is a simplified block diagram of an embedded processor with a memory system in accordance with one embodiment of the present invention.

FIG. 3 illustrates a different configuration of an embedded processor. Specifically, in FIG. 3, the embedded processor omits the program cache and one of the program scratch pad memories. Thus, the embedded processor of FIG. 3 has a processing core 210-a, a large program scratch pad memory 260-a, a data cache 220-a, a first data scratch pad memory 230-*a* and a second data scratch pad memory 240-*a*. As explained above, when a memory component is omitted, the memory components further from the processing core slide closer to the processing core. Thus, the omission of the program cache allows program scratch pad memory 260-*a* to be adjacent to processing core 210-*a*. Program scratch pad memory 260-*a* has a larger memory size than program scratch pad memory 260 (FIG. 2). Because the width of the memory components are fixed, program scratch pad memory 260-*a* has a greater length than program scratch pad memory 260. Despite the omission of the program cache and one of the program scratch pad memories and the enlargement of the remaining program scratch pad memory, the embedded processor of FIG. 3 retains a rectangular shape without irregular features that may waste silicon area. A primary benefit of the present invention is that regardless of the changes in the memory configuration, the process core can remain unchanged.

Figure 4:
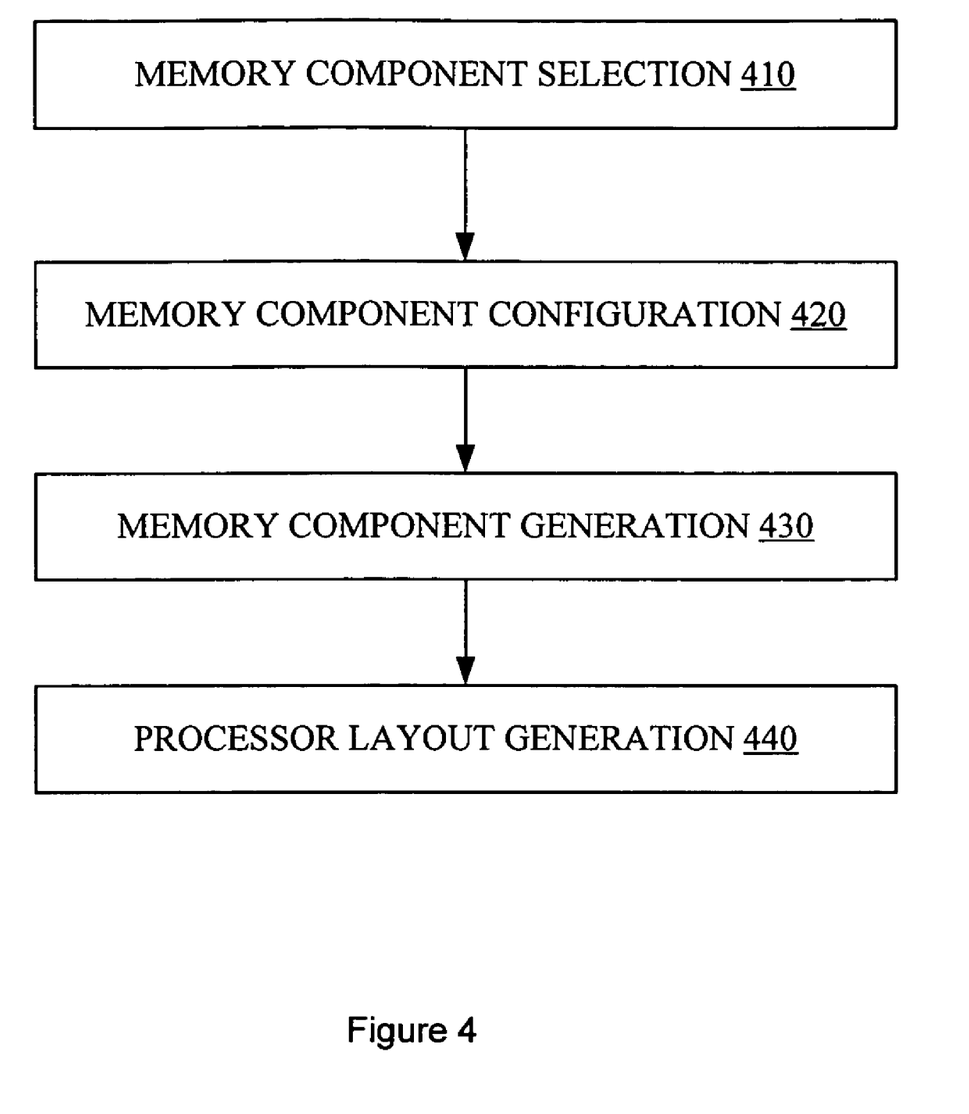
FIG. 4 is a process flow diagram in accordance with one embodiment of the present invention.

The principles of the present invention can be practiced with a variety of memory component designs so long as certain basic features are present in the memory components. Specifically, the memory components have a fixed width and expand lengthwise to accommodate larger memory sizes or different type of memories. FIG. 4 illustrates a process flow 400 in the creation of a specific configuration of a configurable embedded processor for a customer. For process flow 400, the design and layout of the processing core has already been completed. First in step memory component selection stage 410, the customer selects which memory components are present in the embedded processor. Then, in memory component configuration stage 420, the customer decides on the memory size, memory type, and features of the memory components. For example if the memory component is a cache, the customer may be able to select different size sets and different number of "ways" in a N-Way set associative cache. Then, in memory generation stage 430, a memory generator generates the memory components that have the same width as the processing core and that match the customer's configuration. Because memory components have the same width, memory components having larger memory size would have a greater length than memory components having a smaller memory size. As used herein, generating a memory component includes referencing a pre-generated memory component design that could be for example stored in a memory component library. Then, in processor layout generation stage 440, the memory components are attached to the processing core based on priority. In most embodiments of the present invention, priority is based on critical timing within one memory cycle. For example, the physical timing of a cache is in general more critical than the physical timing of a scratch pad memories, thus caches have higher priority than scratch pad memories. In general if both program memory components and data memory components are used, the program memory components are placed adjacent to one side of the processing core and the data memory components are placed adjacent an opposite side of the processing core. Because the memory components are the same width as the processing core, the embedded processor has a rectangular shape.

Figure 5:
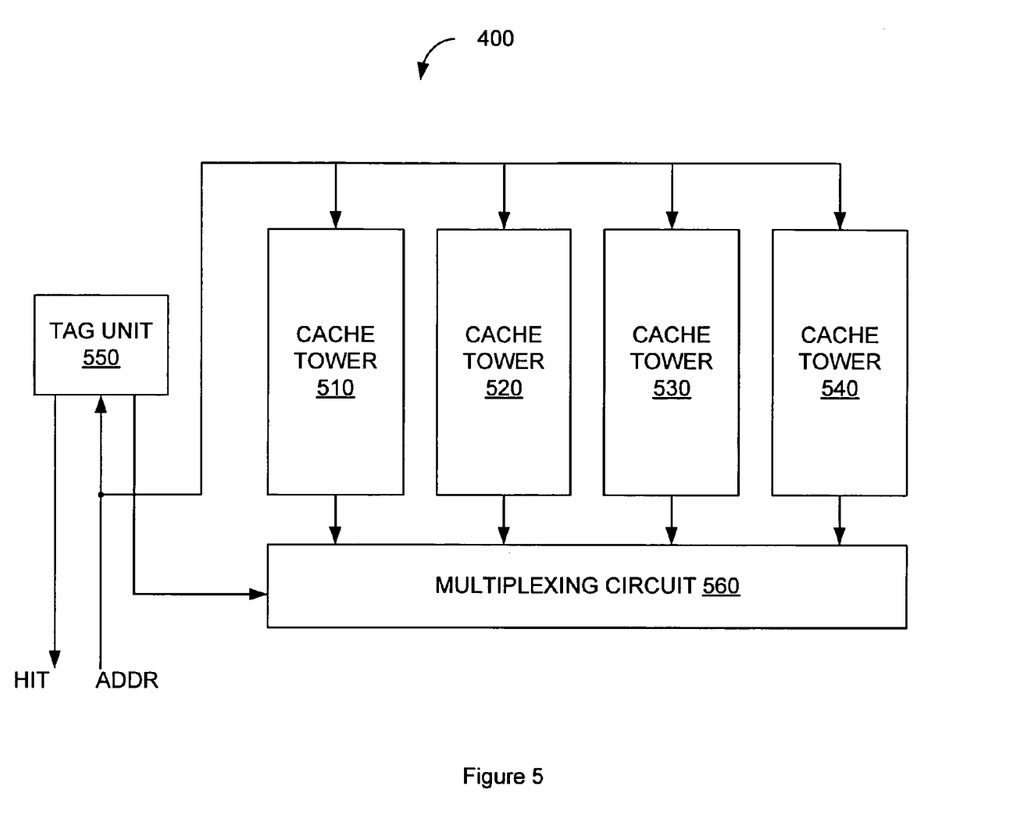
FIG. 5 is a block diagram of a cache in accordance with one embodiment of the present invention

FIG. 5 illustrates a cache 500 in accordance with one embodiment of the present invention. Cache 500, which can be used as a program cache or a data cache, includes four cache towers 510, 520, 530 and 540, a tag unit 550, and a multiplexing circuit 560. Tag unit 550 and cache towers 510, 520, 530, and 540 receive an address ADDR. Tag unit 550 determines whether cache 500 is caching address ADDR. And generates a hit signal HIT to indicate whether address ADDR is cached in cache 500. Logically, each cache tower provides one half word (16 bits of data) during each memory access. Cache 500 is 4-way set associative thus each cache tower is logically subdivided (not shown) into 4 way sub-towers that are each logically 16 bits wide. All four way sub-towers are activated simultaneously to select the proper 16 bits of data. Thus each cache tower has at least 64 sense amps. However, because the width of each of the memory components are selected to be equal to the width of the processing core, each cache tower in cache 500 may physically include more sense amps which are multiplexed down to the logical 64 bits. Each cache tower is physically identical and has a fixed width to accommodate the sense amps. While the cache towers in a specific instance of cache 500 are identical, different instances of cache 500, which are of different size, will have cache towers of different lengths. Multiplexing circuit 560 receives data from all the "ways" and provides the data from the appropriate "way" as data DATA. In some embodiments of the present invention multiplexing circuit 560 may act as a data aligner, which rearranges the order of the data as needed to support unaligned access. Operation of a Cache that supports unaligned access is described in co-owned and co-pending U.S. patent application Ser. No. 10/777,710 entitled "Fast Unaligned Cache Access System and Method" by Oberlaender, which is herein incorporated by reference.

Figure 6:
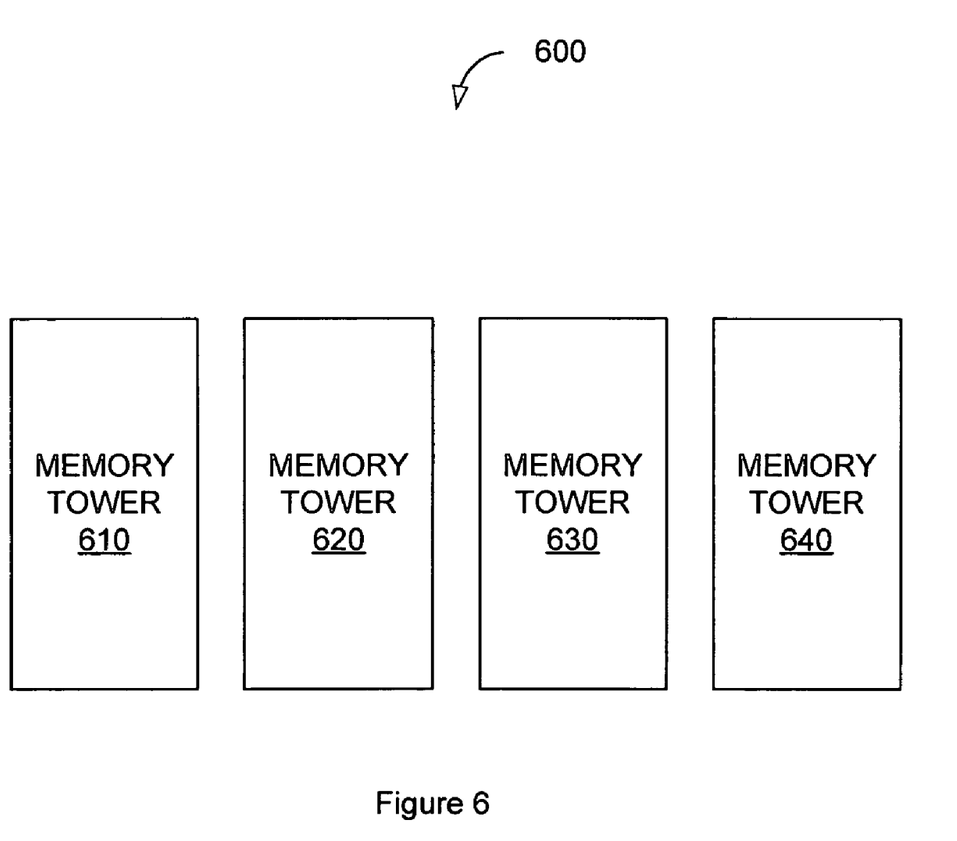
FIG. 6 is a block diagram of a scratch pad memory in accordance with one embodiment of the present invention.

FIG. 6 illustrates a scratch pad memory 600 in accordance with one embodiment of the present invention. Scratch pad memory 600, which can be used as program scratch pad memory or data scratch pad memory, includes four memory towers 610, 620, 630, and 640. For the embodiment of FIG. 6, each memory tower logically provides a half word (16 bits) during a memory access. Four memory towers are used in scratch pad memory to support unaligned memory accesses as described in co-owned and co-pending U.S. patent application Ser. No. 10/777,570 by Oberlaender, et al., entitled "Fast Unaligned Memory Access System and Method, which is herein incorporated by reference. Logically, each memory tower only requires 16 sense amps. However as described above, the memory components and the processing core are configured to have the same width. Thus, in most embodiments of the present memory towers are generated to use more bit lines and sense amps to make use of the additional width of the memory component. Multiplexing within each memory towers reduces the physical number of data bits from the sense amps to the logical number of bits required. For example, in a specific embodiment of the present invention, caches are 4 way set associative and each cache tower require with 64 logical bits of output. However, to increase the width of the cache to the width of a particular processing core, the cache towers are implemented with 256 sense amps and 4 to 1 multiplexing to reduce the 256 bits from the sense amps to the 64 logical bits. The memory towers are also implemented using 256 sense amps. However the memory towers require 16 logical bits of data. Therefore, each memory tower uses 16 to 1 multiplexing to reduce the 256 bits of data from the sense amps to the required 16 bits.

In the various embodiments of this invention, novel structures and methods have been described to provide a configurable memory system for an embedded processor that allows the embedded processor to have a rectangular shape despite changing memory configurations. Keeping a rectangular shape reduces the likelihood of wasted silicon area on a system using the embedded processor, which leads to lower costs in producing the system, greater flexibility, and faster time to market. Furthermore, the present invention reduces risk of errors because the processing core does not need to change between various configurations of the embedded processor. The various embodiments of the structures and methods of this invention that are described above are illustrative only of the principles of this invention and are not intended to limit the scope of the invention to the particular embodiments described. For example, in view of this disclosure, those skilled in the art can define other caches, scratch pad memories, processing cores, memory towers, cache towers, and so forth, and use these alternative features to create a method or system according to the principles of this invention. Thus, the invention is limited only by the following claims.

What is claimed is:

1. An embedded processor comprising:
   a processing core having a processing core width;
   a first memory component adjacent to a first side of the processing core;
   a second memory component adjacent to the first memory component; wherein the second memory component and the processing core are on opposite sides of the first memory component and each memory component having the same width as the primary core width.

2. The embedded processor of claim 1, wherein the processing core width is equal to a first memory component width and a second memory component width.

3. The embedded processor of claim 1, wherein the first memory component if a cache.

4. The embedded processor of claim 3, wherein the second memory component is a scratch pad ram.

5. The embedded processor of claim 1, further comprising a third memory component adjacent to the second memory component, wherein the first memory component and the third memory component are opposite sides of the second memory component.

6. The embedded processor of claim 1, further comprising a third memory component adjacent to the processing core, wherein the third memory component and the first memory component are on opposite sides of the processing core.

7. The embedded processor of claim 6, wherein the first memory component is a data cache and the third memory component is a program cache.

8. The embedded processor of claim 6, wherein the first memory component is a cache and the third memory component is a scratch pad ram.

9. The embedded processor of claim 6, wherein the first memory component has a first memory size and the third memory component has a second memory size.

10. The embedded processor of claim 9, wherein the first memory size is not equal to the second memory size.

11. The embedded processor of claim 6, further comprising a fourth memory component adjacent to the third memory component, wherein the processing core and the fourth memory component are on opposite sides of the third memory component.

12. The embedded processor of claim 6, wherein the processing core width is equal to a first memory component width, a second memory component width, and a third memory component width.

13. The embedded processor of claim 1, wherein the first memory component has a first memory size and the second memory component has a second memory size.

14. The embedded processor of claim 13, wherein the first memory size is not equal to the second memory size.

15. A method of generating an embedded processor having a processing core, the method comprising:
    selecting a plurality of memory components for the embedded processor;
    configuring the memory components;
    generating the memory components, wherein each memory component has a same width as the processing core;
    placing a first memory component of the plurality of memory components adjacent to the processing core; and
    placing a second memory component of the plurality of memory components adjacent to the first memory component, wherein the processing core and the second memory components are on opposite sides of the first memory component.

16. The method of claim 15, further comprising placing a third memory component of the plurality of memory components adjacent to the second memory component, wherein the third memory component and the first memory component are on opposite sides of the second memory component.

17. The method of claim 15, wherein the first memory component is a cache and the second memory component is a scratch pad memory.

18. The method of claim 15, wherein the first memory component is a first scratch pad memory and the second memory component is a second scratch pad memory.

19. The method of claim 15, further comprising placing a second memory component adjacent to the processing core, wherein the first memory component and the second memory components are on opposite sides of the processing core.

20. The method of claim 19, wherein the first memory component is a program cache and the second memory component is a data cache.

21. The method of claim 19, wherein the first memory component is a program cache and the second memory component is a scratch pad memory for data.

22. The method of claim 19, wherein the first memory component is a scratch pad memory for program instructions and the second memory component is a data cache.

23. The method of claim 19, further comprising placing a third memory component adjacent to the first memory component, wherein the third memory component and the processing core are on opposite sides of the first memory component.

24. The method of claim 23, further comprising placing a fourth memory component adjacent to the second memory component, wherein the fourth memory component and the processing core are on opposite sides of the second memory component.

25. The method of claim 15, wherein the configuring the plurality of memory components comprises selecting a memory size for each memory component.

26. The method of claim 15, wherein the configuring the plurality of memory components comprises selecting a number of ways for a first memory component, wherein the first memory component is a set associative cache.

27. The method of claim 15, wherein the configuring a plurality of memory components comprises selecting a memory type for each memory component.

28. A system for generating an embedded processor having a processing core, the system comprising:
    means for selecting a plurality of memory components for the embedded processor;
    means for configuring the memory components;
    means for generating the memory components, wherein each memory component has a same width as the processing core;

means for placing a first memory component of the plurality of memory components adjacent to the processing core; and means for placing a second memory component of the plurality of memory components adjacent to the first memory component, wherein the processing core and the second memory components are on opposite sides of the first memory component.

29. The system of claim 28, further comprising means for placing a third memory component of the plurality of memory components adjacent to the second memory component, wherein the third memory component and the first memory component are on opposite sides of the second memory component.

30. The system of claim 28, wherein the first memory component is a cache and the second memory component is a scratch pad memory.

31. The system of claim 28, wherein the first memory component is a first scratch pad memory and the second memory component is a second scratch pad memory.

32. The system of claim 28, further comprising means for placing a third memory component adjacent to the first memory component, wherein the third memory component and the processing core are on opposite sides of the first memory component.

33. The system of claim 32, further comprising means for placing a fourth memory component adjacent to the second memory component, wherein the fourth memory component and the processing core are on opposite sides of the second memory component.

34. The system of claim 28, wherein the means for configuring the plurality of memory components comprises means for selecting a memory size for each memory component.

35. The system of claim 28, wherein the means for configuring the plurality of memory components comprises means for selecting a number of ways for a first memory component, wherein the first memory component is a set associative cache.

36. The system of claim 28, wherein the means for configuring a plurality of memory components comprises means for selecting a memory type for each memory component.

37. A system for generating an embedded processor having a processing core, the system comprising:

means for selecting a plurality of memory components for the embedded processor;

means for configuring the memory components;

means for generating the memory components, wherein each memory component has a same width as the processing core; and means for placing a second memory component adjacent to the processing core, wherein the first memory component and the second memory components are on opposite sides of the processing core.

* * * * *